(12) United States Patent
Wu et al.

(10) Patent No.: US 7,915,644 B2
(45) Date of Patent: *Mar. 29, 2011

(54) WIDE BANDGAP HEMTS WITH SOURCE CONNECTED FIELD PLATES

(75) Inventors: Yifeng Wu, Goleta, CA (US); Primit Parikh, Goleta, CA (US); Umesh Mishra, Montecito, CA (US); Marcia Moore, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/437,505

(22) Filed: May 7, 2009

(65) Prior Publication Data

US 2009/0236635 A1 Sep. 24, 2009

Related U.S. Application Data

(62) Division of application No. 10/958,970, filed on Oct. 4, 2004, now Pat. No. 7,550,783.

(60) Provisional application No. 60/570,519, filed on May 11, 2004.

(51) Int. Cl.
*H01L 29/66* (2006.01)
*H01L 29/02* (2006.01)

(52) U.S. Cl. ............... 257/194; 257/488; 257/E29.246; 257/E21.403; 257/E21.407; 257/E29.009; 257/E29.017; 438/140; 438/172; 438/454

(58) Field of Classification Search .................. None
See application file for complete search history.

(56) References Cited

U.S. PATENT DOCUMENTS

| | | | |
|---|---|---|---|
| 4,551,905 A | 11/1985 | Chao et al. | 29/571 |
| 4,947,232 A | 8/1990 | Ashida et al. | 357/53 |
| 5,192,987 A | 3/1993 | Khan et al. | 257/183.1 |
| 5,196,359 A | 3/1993 | Shih et al. | 437/40 |
| 5,290,393 A | 3/1994 | Nakamura | 156/613 |
| 5,296,395 A | 3/1994 | Khan et al. | 437/40 |
| 5,393,993 A | 2/1995 | Edmond et al. | 257/77 |
| 5,399,886 A | 3/1995 | Hasegawa | 257/192 |
| 5,523,589 A | 6/1996 | Edmond et al. | 257/77 |
| 5,569,937 A | 10/1996 | Bhatnagar | 257/77 |
| 5,652,179 A | 7/1997 | Strifler et al. | 438/578 |
| 5,686,738 A | 11/1997 | Moustakas | 257/103 |

(Continued)

FOREIGN PATENT DOCUMENTS

CN 1428870 A 7/2003

(Continued)

OTHER PUBLICATIONS

First Examination Report from related European Application No. 04 788 642.9-2203, Dated: Dec. 22, 2009.

(Continued)

*Primary Examiner* — Hoang-Quan T Ho
(74) *Attorney, Agent, or Firm* — Koppel, Patrick, Heybl & Dawson

(57) ABSTRACT

A HEMT comprising an active region comprising a plurality of active semiconductor layers formed on a substrate. Source electrode, drain electrode, and gate are formed in electrical contact with the active region. A spacer layer is formed on at least a portion of a surface of said active region and covering the gate. A field plate is formed on the spacer layer and electrically connected to the source electrode, wherein the field plate reduces the peak operating electric field in the HEMT.

21 Claims, 4 Drawing Sheets

U.S. PATENT DOCUMENTS

| | | | | |
|---|---|---|---|---|
| 5,739,554 | A | 4/1998 | Edmond et al. | 257/103 |
| 5,929,467 | A | 7/1999 | Kawai et al. | 257/192 |
| 6,033,948 | A | 3/2000 | Kwon et al. | 438/217 |
| 6,057,564 | A | 5/2000 | Rennie | 257/99 |
| 6,100,571 | A | 8/2000 | Mizuta et al. | 257/488 |
| 6,127,703 | A | 10/2000 | Letavic et al. | 257/347 |
| 6,140,169 | A | 10/2000 | Kawai et al. | 438/197 |
| 6,307,232 | B1 | 10/2001 | Akiyama et al. | 257/347 |
| 6,316,793 | B1 | 11/2001 | Sheppard et al. | 257/103 |
| 6,346,451 | B1 | 2/2002 | Simpson et al. | 438/311 |
| 6,445,038 | B1 | 9/2002 | Tihanyi | 257/347 |
| 6,468,878 | B1 | 10/2002 | Petruzzello et al. | 438/454 |
| 6,475,857 | B1 | 11/2002 | Kim | 438/240 |
| 6,483,135 | B1 | 11/2002 | Mizuta et al. | 257/283 |
| 6,495,409 | B1 | 12/2002 | Manfra et al. | 438/216 |
| 6,559,513 | B1 | 5/2003 | Miller et al. | 257/488 |
| 6,584,333 | B1 | 6/2003 | Gauss et al. | 505/220 |
| 6,586,781 | B2 | 7/2003 | Wu et al. | 257/194 |
| 6,586,813 | B2 | 7/2003 | Nagahara | 257/472 |
| 6,624,488 | B1 | 9/2003 | Kim | 257/411 |
| 6,686,616 | B1 | 2/2004 | Allen et al. | 257/280 |
| 6,690,042 | B2 | 2/2004 | Khan et al. | 257/192 |
| 6,933,544 | B2 | 8/2005 | Saito | 257/194 |
| 6,940,090 | B2 | 9/2005 | Saito et al. | 257/20 |
| 2001/0015446 | A1 | 8/2001 | Inoue et al. | |
| 2001/0023964 | A1 | 9/2001 | Wu et al. | |
| 2002/0005528 | A1 | 1/2002 | Nagahara | |
| 2002/0017648 | A1 | 2/2002 | Kasahara et al. | |
| 2002/0137318 | A1 | 9/2002 | Peake et al. | |
| 2002/0155646 | A1 | 10/2002 | Petruzzello et al. | |
| 2002/0167023 | A1 | 11/2002 | Chavarkar et al. | |
| 2003/0006437 | A1 | 1/2003 | Mizuta et al. | |
| 2003/0020092 | A1 | 1/2003 | Parikh et al. | |
| 2003/0107081 | A1 | 6/2003 | Lee et al. | |
| 2003/0132463 | A1 | 7/2003 | Miyoshi | 257/280 |
| 2003/0183844 | A1 | 10/2003 | Yokoyama et al. | |
| 2003/0222327 | A1 | 12/2003 | Yamaguchi et al. | |
| 2004/0188775 | A1 | 9/2004 | Peake et al. | |
| 2005/0051796 | A1 | 3/2005 | Parikh et al. | |
| 2005/0062069 | A1 | 3/2005 | Saito et al. | |
| 2005/0082611 | A1 | 4/2005 | Peake et al. | |
| 2005/0110042 | A1 | 5/2005 | Saito et al. | |
| 2005/0189559 | A1* | 9/2005 | Saito et al. | 257/189 |
| 2006/0071247 | A1 | 4/2006 | Chen et al. | |

FOREIGN PATENT DOCUMENTS

| | | |
|---|---|---|
| CN | 1639875 A | 7/2005 |
| EP | 0069429 | 1/1983 |
| EP | 0792028 | 8/1997 |
| EP | 1336989 | 8/2003 |
| JP | 05021793 A | 1/1993 |
| JP | 07176544 | 7/1995 |
| WO | WO9908323 | 2/1999 |
| WO | WO03038905 A2 | 5/2003 |
| WO | WO2004068590 A1 | 8/2004 |
| WO | WO2005114743 | 12/2005 |
| WO | WO2006025971 | 3/2006 |

OTHER PUBLICATIONS

Second Office Action From Related Chinese Application No. 200480032782.1, Dated: Dec. 28, 2009.

Office Action from related U.S. Appl. No. 11/078,265, Dated: Jan. 20, 2010.

Office Action from related U.S. Appl. No. 11/807,701, Dated: Jan. 26, 2010.

Office Action from related U.S. Appl. No. 10/958,945, Dated: Jan. 28, 2010.

Second Office Action from related Chinese Application No. 200580014866.7, Dated: Nov. 25, 2009.

From related application: Chinese Patent Application No. 200580014868.6, Second Office Action dated Feb. 24, 2010.

Office Action from related U.S. Appl. No. 10/958,970, dated: Nov. 10, 2005.

Response to related Office Action U.S. Appl. No. 10/958,970, dated: Apr. 10, 2006.

Office Action from related U.S. Appl. No. 10/958,970, dated: Jun. 29, 2006.

Response to related Office Action U.S. Appl. No. 10/958,970, dated: Dec. 29, 2006.

Office Action from related U.S. Appl. No. 10/958,970, dated: Mar. 29, 2007.

Response to related Office Action U.S. Appl. No. 10/958,970, dated: Oct. 1, 2007.

Office Action from related U.S. Appl. No. 10/958,970, dated: Jan. 8, 2008.

Response to related Office Action U.S. Appl. No. 10/958,970, dated: Jun. 8, 2008.

Office Action from related U.S. Appl. No. 10/958,970, dated: Sep. 10, 2008.

Response to related Office Action U.S. Appl. No. 10/958,970, dated: Dec. 5, 2008.

Notice of Allowance from related U.S. Appl. No. 10/958,970, dated: Feb. 10, 2009.

Examiner's First Report on Patent Application re related Australian Application No. 2005246697 dated Mar. 19, 2010.

International Preliminary Examination Report re related PCT Application, PCT/US05/13725 mailed May 25, 2007.

Saito et al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, No. 4B, Apr. 2004 pp. 2239-2242, XP001227744, ISSN: 0021-4922.

Saito et al. Solid State Electronics, Theoretical Limit Estimation of Lateral Wide Bandgap Semiconductor Power-Switching Device Apr. 1, 2003, p. 1555-1562.

Saito et al. "High Breakdown Voltage AlGaN-GaN Power HEMT Design and High Current Density Switching Behavior", IEEE Transactions on Electron Devices, vol. 50, No. 12, Dec. 2003, pp. 2528-2531.

Heikman et al. "Growth of FE Doped Semi-Insulating GaN by Metalorganic Chemical Vapor Deposition" Applied Physics Letters, vol. 81, No. 3, Jul. 2002, pp. 439-441.

Heikman, Growth and Characteristics of FE-Doped GaN, Journal of Crystal Growth 248 (2003), 513-517.

IEEE Electron Device Letters, vol. 18, No. 10, (Oct. 1997), p. 492.

Wu et al. "High A1 Content AlGaN/GaN HEMTS With Very High Performance", IEDM 1999 Digest pp. 925-927, Washington, D.C. Dec. 1999.

IEEE Transactions on Electron Devices, vol. 48, No. 3 Mar. 2001, p. 581-585.

Kahn et al., "AlGaN/GaN Metal-Oxide-Semiconductor Heterostructure Field-Effect Transistors on SIC Substrates", Applied Physics Letters, American Institute of Physics. New York, US, vol. 77, No. 9, Aug. 2000, p. 1339-1341, XP000951319 ISSN: 0003-6951.

Lu et al. "P-Type SiGe Transistors With Low Gate Leakage Using Sin Gate Dielectric", IEEE Electron Device Letters, IEEE, Inc., New York, US, vol. 20, No. 10, Oct. 1999, p. 514-516, XP000890470, ISSN: 0741-3106.

Zhang N-Q et al., "High Breakdown GaN HEMT With Overlapping Gate Structure", IEEE Electron Device Letters, IEEE, Inc. NewYork, US, vol. 9, Sep. 2000, p. 373-375, XP000954354, ISSN: 0741-3106.

Tillak, et al., "Effect of Passivation on AlGaN/GaN HEMT Device Performance" 2000 IEEE International Symposium on Compound Semiconductor. Proceedings of the IEEE 27th International Symposium on Compound Semiconductors (CAT. No. 00th 8498), 2000 IEEE International Symposium on Compound Semicocnductors Proceedings of the, p. 357-363, XP002239700, 2000 Piscataway, NY, USA, IEEE, US ISBN: 0-7803-6258-6.

S. Karmalkar, U.K. Mishra, "Very High Voltage AlGaN/GaN High Electron Mobility Transistors Using a Field Plate Deposited on a Stepped Insulator." *Solid-State Electronics* vol. 45, (2001) pp. 1645-1652.

W. Saito et al., "600V AlGaN/GaN Power-HEMT: Design, Fabrication and Demonstration on High Voltage DC-DC Converter." *IEEE IEDM* vol. 23, No. 7, (2003) pp. 587-590.

Wu et al., "High-Gain Microwave GaN HEMTS With Source-Terminated Field-Plates", CREE Santa Barbara Technology Center.

Wu et al., "30-W/MM GaN HEMTS by Field Plate Optimization", IEEE, vol. 25, No. 3, Mar. 2004, p. 117-119.

Gaska et al., "High Temperature Performance of AlGaN/GaN HFET's on SiC Substrates." *IEEE Electron Device Letters* vol. 18, No. 10, (Oct. 1997) p. 492.

Ping et al., "DC and Microwave Performance of High Current AlGaN Heterostructure Field Effect Transistors Grown on P-Type SiC Substrate." *IEEE Electron Device Letters* vol. 19, No. 2, (Feb. 1998) p. 54.

L. Eastman, K. Chu, J. Smart, J. R. Shealy, "GaN Materials for High Power Microwave Amplifiers." *Materials Research Society* vol. 512 WOCSEMMAD, Monterey, CA (Feb. 1998) p. 3-7.

G. Sullivan et al., "High Power 10-GHz Operation of AlGaN HFET's in Insulating SiC." *IEEE Electron Device Letters* vol. 19, No. 6, (Jun. 1999) p. 198.

Wu et al., "High AL-Content AlGaN/GaN MODFETs for Ultrhigh Performance." *IEEE Electron Device Letters* vol. 19, No. 2, (Feb. 1998), p. 50.

Y. Ando, et al., "10-W/mm AlGaN-GaN HFET With a Field Modulating Plate." *IEEE Electron Device Letters* vol. 24, No. 5, (May 2003) p. 289-292.

CRC Press, *The Electrical Engineering Handbook*, Second Edition, Dorf, (1997) p. 994.

B. Gelmont, K. Kim, and M. Shur. "Monte Carlo Simulation of Electron Transport in Gallium Nitrate." *Journal of Applied Physics*, vol. 74, Issue 3, (Aug. 1, 1993) p. 1818.

R. Gaska, J.W. Yang, A. Osinsky, Q. Chen, M.A. Khan, A.O. Orlov, G.L. Snider, M.S. Shur. "Electron Transport in AlGaN Heterostructures Grown on 6H-SiC Substrates." *Applied Physics Letters*, vol. 72, No. 6 (Feb. 9, 1998) p. 707.

Y. F. Wu et. al. "GaN-Based FETs for Microwave Power Amplification." *IEICE Transactions on Electronics*, E-82-C, (1999) p. 1895.

Y.F. Wu, D. Kapolnek, J.P. Ibettson, P. Parikh, B.P. Keller, and U.K. Mishra. "Very-High Power Density AlGaN/GaN HEMTS." *IEEE Transactions on Electronic Devices*, vol. 48, Issue 3 (Mar. 2001) p. 586.

M. Micovic, A. Kurdoghlian, P. Janke, P. Hashimoto, D.W.S. Wong, J. S. Moon, L. McRAY, and C. Nguyen. "AlGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001).

Li J, et al "High Breakdown Voltage GaN HFET With Field Palte" Electronics Letters, IEE Stevenage, GB vol. 37, No. 3, Feb. 1, 2001, pp. 196-197, XP006016221.

Xing H. et al. "High Breakdown Voltage AlGaN-GaN HEMTS Achieved by Multiple Field Plates" IEEE Electron Device Letters, IEEE Inc. New York, US. vol. 25, No. 4, Apr. 2004, pp. 161-163, XP001190361.

Asano K et al: 'Novel High Power AlGaAs/GaAs HFET With a Field-Modulating Plate Operated At 35 V Drain Voltage°, Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010321500.

Wakejima A et al, "High Power Density and Low Distortion INGAP Channel FETS With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.

Mok P K T et al, "A Novel High-Voltage High-Speed MESFET Using a Standard GAAS Digital IC Process" IEEE Transactions on Electron Devices, IEEE Inc. New York, US. vol. 41, No. 2, Feb. 1, 1994, pp. 246-250, XP000478051.

Japanese Patent Application Laid-open No. 2002-016245 Patent Abstracts of Japan.

Japanese Patent Application Laid-open No. 2001230407 Patent Abstracts of Japan.

Japanese Patent Application Laid-open No. 2002-343814 Patent Abstracts of Japan.

Japanese Patent Application Laid-open No. 63-087773 Patent Abstracts of Japan.

Japanese Patent Application Laid-open No. 2001-230263 Patent Abstracts of Japan.

Japanese Patent Application No. 2003-307916 (Laid-open No. 2005-079346) Patent Abstracts of Japan.

Japanese Patent Application No. 2003-081849 (Laid-open No. 2004-289038) Patent Abstracts of Japan.

Official Notice of Rejection mailed on Jun. 24, 2008, Japanese Patent Application No. 2006-526270 and comments.

First Office Action re related Chinese Application No. 200580015278.5, Dated May 9, 2008.

European Examination Report Application No. 05731252.2-2203 Dated: Jul. 30, 2008.

First Office Action from related China, Application No. 200480032782.1, Dated: Jul. 18, 2008.

Office Action from related, U.S. Appl. No. 11/807,701, dated Aug. 22, 2008.

Office Action from related, U.S. Appl. No. 10/958,970, dated Sep. 10, 2008.

PCT International Preliminary Report for Group of Related Applications, PCT/US05/09884, Dated: Aug. 25, 2008.

Second Office Action from related China Application No. 200580015278.5, Dated: Dec. 19, 2008.

Communication Pursuant to Article 94(3) EPC re: related European Application No. 07018026.0.

Patent Abstracts of Japan, Pub. No. 07176544, Pub. Date: Jul. 14, 1995.

Official Notice of Final Decision of Rejection re Japan Patent App. No. 2006-526270, Dated: Jan. 23, 2009.

Third Office Action regarding related Chinese Application No. 200580015278.5, dated: May 15, 2009.

First Official Communication regarding the related European Application No. 07018026.0, Dated: Dec. 17, 2008.

Official Notice of Rejection mailed on Jun. 24, 2008, Japanese Patent Application No. 2006-526270 and comments.

Office Action from European Patent Application No. 05756258.9 dated Jun. 10, 2010.

* cited by examiner

|  | No FP | FP connected to gate | FP connected to source |
|---|---|---|---|
| MSG at 4 GHz (dB) | 18.6 | 14.7 | 19.9 |
| S12 4 GHz | 0.0795 | 0.136 | 0.0572 |
| S12 compared to none- FP device (%) | 100% | 171% | 72% |

WIDE BANDGAP HEMTS WITH SOURCE CONNECTED FIELD PLATES

RELATED APPLICATION DATA

This application is a divisional of and claims the benefit of U.S. patent application Ser. No. 10/958,970 filed on Oct. 4, 2004 now U.S. Pat. No. 7,550,783, which claims the benefit of U.S. Provisional patent application Ser. No. 60/570,519 filed May 11, 2004.

STATEMENT AS TO FEDERALLY SPONSORED RESEARCH

This invention was made with Government support under ONR/DARPA Government Contract No. N00014-02-0306. The Government has certain rights in this invention.

BACKGROUND OF THE INVENTION

1. Field of the Invention

The present invention relates to transistors and particularly to transistors utilizing field plates.

2. Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821]. AlGaN/GaN HEMTs can also have 2 DEG sheet densities in excess of $10^{13} cm^{-2}$ and relatively high electron mobility (up to 2019 $cm^2/Vs$) [R. Gaska, et al., *Electron Transport in AlGaN—GaN Heterostructures Grown on 6H—SiC Substrates*, Appl. Phys. Lett. 72, (1998), pp. 707-709]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., *GaN-Based FETs for Microwave Power Amplification*, IEICE Trans. Electron. E-82-C, (1999). pp. 1895-1905]. More recently, AlGaN/GaN HEMTs grown on SiC have shown a power density of 9.8 W/mm at 8 GHz [Y. F. Wu, et al., *Very-High Power Density AlGaN/GaN HEMTs*, IEEE Trans. Electron. Dev. 48, (2001), pp. 586-590] and a total output power of 22.9 W at 9 GHz [M. Micovic, et al., *AlGaN/GaN Heterojunction Field Effect Transistors Grown by Nitrogen Plasma Assisted Molecular Beam Epitaxy*, IEEE Trans. Electron. Dev. 48, (2001), pp. 591-596].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., *High-Temperature Performance of AlGaN/GaN HFET's on SiC Substrates*, IEEE Electron Device Letters, 18, (1997), pp. 492-494; and Ping et al., *DC and Microwave Performance of High Current AlGaN Heterostructure Field Effect Transistors Grown on P-type SiC Substrates*, IEEE Electron Devices Letters 19, (1998), pp. 54-56. Some of these devices have shown a gain-bandwidth product ($f_T$) as high as 67 gigahertz [K. Chu et al. WOCSEMMAD, Monterey, Calif. (February 1998)] and high power densities up to 2.84 W/mm at 10 GHz [G. Sullivan et al., *High Power 10-GHz Operation of AlGaN HFET's in Insulating SiC*, IEEE Electron Device Letters 19, (1998), pp. 198-200; and Wu et al., *High Al-Content AlGaN/GaN MODFETs for Ultrahigh Performance*, IEEE Electron Device Letters 19, (1998), pp. 50-53].

Electron trapping and the resulting difference between DC and RF characteristics have been a limiting factor in the performance of these devices. Silicon nitride (SiN) passivation has been successfully employed to alleviate this trapping problem resulting in high performance devices with power densities over 10 W/mm at 10 Ghz. For example, U.S. Pat. No. 6,586,781, which is incorporated herein by reference in its entirety, discloses methods and structures for reducing the trapping effect in GaN-based transistors. However, due to the high electric fields existing in these structures, charge trapping is still an issue.

Field plates (FP) have been used to enhance the performance of GaN-based HEMTs at microwave frequencies [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. These approaches, however, have involved a field plate connected to the gate of the transistor with the field plate on top of the drain side of the channel. This can result in a significant FP-to-drain capacitance and the field plate being connected to the gate adds additional gate-to-drain capacitance (Cgd) to the device. This can not only reduce gain, but can also cause instability due to poorer input-output isolation.

SUMMARY OF THE INVENTION

The present invention provides transistors with a field plate connected to the source electrode, with typical transistors utilizing the invention being HEMTs. One embodiment of a HEMT according to the present invention comprises a plurality of active semiconductor layers formed on a substrate with a two dimensional electron gas (2 DEG) at the heterointerface between two of said plurality of active layers. Source and drain electrodes are formed in contact with the 2 DEG and a gate is formed between the source and drain electrodes and on the plurality of active layers. A spacer layer is formed on at least part of the surface of the plurality of active layers between the gate and the drain electrode. A field plate is formed on the spacer layer with at least one conductive path electrically connecting the field plate to the source electrode, the at least one conductive path covering less than all of the topmost surface between gate and source electrode.

Another embodiment of a HEMT according to the present invention comprises a buffer layer and barrier layer formed successively on a substrate and a two dimensional electron gas (2 DEG) at the heterointerface between the buffer and barrier layers. A source and a drain electrode are included both making ohmic contact with the 2 DEG and a gate is included on the barrier layer between the source and drain electrodes. A spacer layer covers at least a portion of the barrier layer between the gate and drain electrode. A field plate is included on the spacer layer isolated from the barrier layer and extending a distance $L_f$ from the gate toward the drain electrode. The field plate is electrically connected to the source electrode by at least one conductive path that covers less than all of the topmost layer between the gate and source electrode.

Still another embodiment of a HEMT according to the present invention comprises a plurality of active semiconductor layers formed on a substrate and a two dimensional electron gas (2 DEG) at the heterointerface between two of the plurality of active layers. Source and drain electrodes are included in contact with the 2 DEG. A gate is included between the source and drain electrodes and on the plurality of active layers. A field plate extends a distance $L_f$ from the edge of the gate to the drain electrode, with the field plate isolated from the gate electrode and active layers. At least one conductive path electrically connects the field plate to the source electrode, with the at least one conductive path covering less than all of the topmost surface between gate and source electrode.

These and other further features and advantages of the invention would be apparent to those skilled in the art from the following detailed description, taking together with the accompanying drawings, in which:

DETAILED DESCRIPTION OF THE INVENTION

Figure 1:
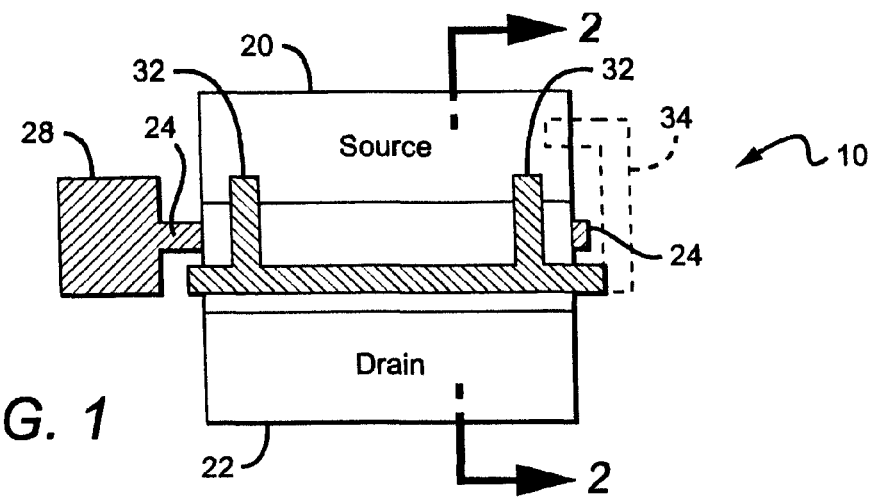
FIG. 1 is a plan view of one embodiment of a HEMT according to the present invention.

The field plate arrangements according to the present invention can be used with many different transistor structures. Wide bandgap transistor structures generally include an active region, with metal source and drain electrodes formed in electrical contact with the active region, and a gate electrode formed between the source and drain electrodes for modulating electric fields within the active region. A spacer layer is formed above the active region. The spacer layer can comprise a dielectric layer, or a combination of multiple dielectric layers. A conductive field plate is formed above the spacer layer and extends a distance $L_f$ from the edge of the gate electrode toward the drain electrode.

The field plate can be electrically connected to the source electrode. This field plate arrangement can reduce the peak electric field in the device, resulting in increased breakdown voltage and reduced trapping. The reduction of the electric field can also yield other benefits such as reduced leakage currents and enhanced reliability. By having the field plate electrically connected to the source electrode, the reduced gain and instability resulting from gate connected field plates is reduced. When arranged according to the present invention, the shielding effect of a source-connected field plate can reduce Cgd, which enhances input-output isolation.

One type of transistor that can utilize the field plate arrangement according to the present invention is a high electron mobility transistor (HEMT), which typically includes a buffer layer and a barrier layer on the buffer layer. A two dimensional electron gas (2 DEG) layer/channel is formed at the junction between the buffer layer and the barrier layer. A gate electrode is formed on the barrier layer between source and drain electrodes.

According to the present invention, a spacer layer is formed on the barrier layer covering at least a portion of the barrier layer between the gate and drain electrode such that a field plate can be formed on the spacer layer in electric isolation from the barrier layer. In other embodiments the spacer layer can also cover all or some of the gate such that the field plate can overlap the gate while remaining in electrical isolation from the gate and the barrier layer. In a preferred embodiment the spacer layer covers the gate and the surface of the barrier layer between the gate and the source and drain electrodes. The spacer layer can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof, or epitaxial materials as described below.

A conductive field plate is formed on the spacer layer and extends a distance $L_f$ from the edge of the gate towards the drain electrode, with the field plate and gate electrode typically being formed during separate deposition steps. The field plate is also electrically connected to the source electrode.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Figure 2:
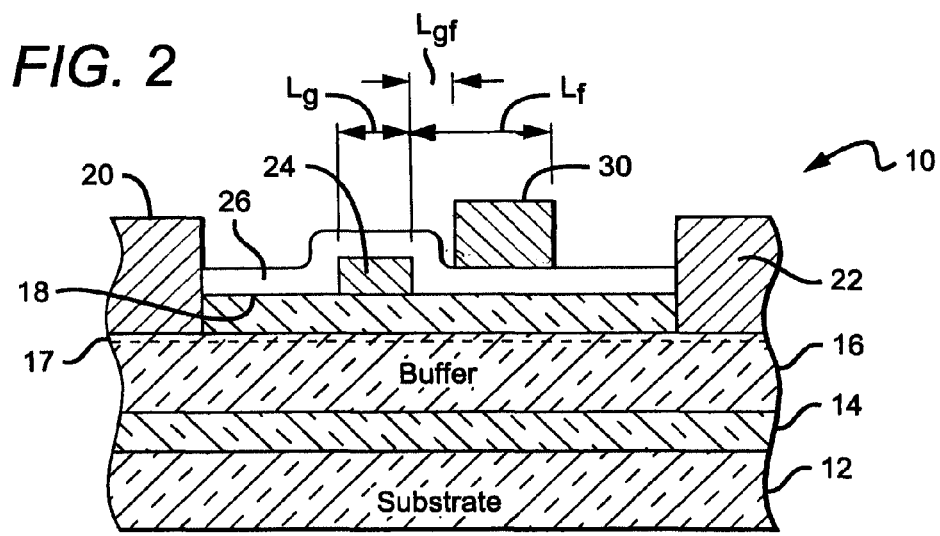
FIG. 2 is a sectional view of the HEMT in FIG. 1.

FIGS. 1 and 2 show one embodiment of a nitride based HEMT 10 according to the present invention which comprises a substrate 12 of silicon carbide, sapphire, spinet, ZnO, silicon, gallium nitride, aluminum nitride, or any other material capable of supporting growth of a Group-III nitride material. In some embodiments, the substrate 12 can comprise semi-insulating 4H—SiC commercially available from Cree, Inc. of Durham, N.C.

A nucleation layer 14 can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ (0<=z<=1). The nucleation layer 14 can be formed on the substrate 12 using known semiconductor growth techniques such as Metal Oxide Chemical Vapor Deposition (MOCVD), Hydride Vapor Phase Epitaxy (HVPE), or Molecular Beam Epitaxy (MBE).

The formation of the nucleation layer 14 can depend on the material used for the substrate 12. For example, methods of forming a nucleation layer 14 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further comprises a high resistivity buffer layer 16 formed on the nucleation layer 14, with a suitable buffer layer 16 made of a Group III-nitride material such as $Al_xGa_yIn_{(1-x-y)}N$ ($0<=x<=1$, $0<=y<=1$, $x+y<=1$). In another embodiment according to the present invention the buffer layer 16 comprises a GaN layer that is approximately 2 μm thick, with part of the layer doped with Fe.

A barrier layer 18 is formed on the buffer layer 16 such that the buffer layer 16 is sandwiched between the barrier layer 18 and the nucleation layer 14. Each of the buffer layer 16 and barrier layer 18 can comprise doped or undoped layers of Group III-nitride materials. The barrier layer 18 can comprise one or more layers of different materials such as InGaN, AlGaN, AlN, or combinations thereof. In one embodiment the barrier layer 18 comprises 0.8 nm of AlN and 22.5 nm of $Al_xGa_{1-x}N$ ($x \approx 0.195$, as measured by photo luminescence). Exemplary structures are illustrated in U.S. Pat. Nos. 6,316,793, 6,586,781, 6,548,333 and U.S. Published Patent Application Nos. 2002/0167023 and 2003/00020092 each of which is incorporated by reference as though fully set forth herein. Other nitride based HEMT structures are illustrated in U.S. Pat. Nos. 5,192,987 and 5,296,395 each of which is incorporated herein by reference as if fully set forth herein. The buffer and barrier layers 16, 18 can be made using the same methods used to grow the nucleation layer 14. A two dimensional electron gas (2 DEG) layer/channel 17 is formed at the heterointerface between the buffer and barrier layer 16, 18. Electric isolation between the devices is achieved with mesa etch or ion implementation outside the active area of the HEMT.

Metal source and drain electrodes 20, 22 are formed making ohmic contact through the barrier layer 18, and a gate 24 is formed on the barrier layer 18 between the source and drain electrodes 20, 22. Electric current can flow between the source and drain electrodes 20, 22 through a two-dimensional electron gas (2 DEG) 17 induced at the heterointerface between the buffer layer 16 and the barrier layer 18 when the gate 24 is biased at the appropriate level. The formation of source and drain ohmic contacts 20, 22 is described in detail in the patents and publications referenced above.

The source and drain electrodes 20, 22 can be made of different materials including but not limited to alloys of titanium, aluminum, gold or nickel. The gate 24 can also be made of different materials including but not limited to nickel, gold, platinum, titanium, chromium, alloys of titanium and tungsten, or platinum silicide. The gate 24 can have many different lengths, with a preferred gate length ($L_g$) being approximately 0.5 microns. As best shown in FIG. 1, the gate 24 is connected to and contacted at a gate electrode 28. As described below, in other transistor embodiments according to the present invention the gate 24 can be at least partially recessed in barrier layer 18.

A non-conducting spacer layer 26 can be formed over the gate 24 and the surface of the barrier layer 18 between the gate 24 and the source and drain electrodes 20, 22, although as described above the spacer layer can cover less. The spacer layer 26 can comprise a layer of non-conducting material such as a dielectric. Alternatively, it can comprise a number of different layers of dielectrics or a combination of dielectric layers. The spacer layer can be many different thicknesses, with a suitable range of thicknesses being approximately 0.05 to 2 microns.

When the spacer layer 26 is formed before device metallization the spacer layer 26 can comprise an epitaxial material such as a Group III nitride material having different Group III elements such as alloys of Al, Ga, or In, with a suitable spacer layer material being $Al_xGa_{1-x}N$ ($0<x<1$). After epitaxial growth of the barrier layer 18, the spacer layer 26 can be grown using the same epitaxial growth method. The spacer layer 26 is then etched such that the gate 24, source electrode 20 and drain electrode 22 can be properly formed in contact with the buffer layer 18 and the 2 DEG 17. A field plate can then be deposited on the spacer layer between the gate 24 and drain electrode 22. In those embodiments where the field plate overlaps the gate, an additional spacer layer of dielectric material should be included at least partially over the gate to isolate the gate from the field plate.

A field plate 30 is formed on the spacer layer 26 between the gate 24 and the drain electrode 22, with the field plate 30 being in close proximity to the gate 24 but not overlapping it. A space between the gate 24 and field plate ($L_{gf}$) remains and should be wide enough to isolate from the field plate 30, while being small enough to maximize the field effect provided by the field plate 30. If $L_{gf}$ is too wide the field effect can be reduced. In one embodiment according to the present invention $L_{gf}$ should be approximately 0.4 microns or less, although larger and smaller spaces can also be used.

The field plate 30 can extend different distances $L_f$ from the edge of the gate 24, with a suitable range of distances for $L_f$ being approximately 0.1 to 2 microns. The field plate 30 can comprise many different conductive materials with a suitable material being a metal, or combinations of metals, deposited using standard metallization methods. In one embodiment according to the present invention the field plate 30 comprises titanium/gold or nickel/gold.

The field plate 30 is electrically connected to the source electrode 20 and FIG. 1 shows two connection structures that can be used according to the present invention, although other connection structures can also be used. Conductive buses 32 can be formed on the spacer layer 26 to extend between the field plate 30 and the source electrode 20. Different numbers of buses 32 can be used although the greater the number of buses the greater the unwanted capacitance that can be introduced by the buses and the buses 32 should cover less than all of the all of the topmost surface between gate 24 and source electrode 20. The buses should have a sufficient number so that current effectively spreads from the source electrode 20 into the field plate 30, while not covering too much of the HEMT's active region, with a suitable number of buses 32 being two.

The field plate 30 can alternatively be electrically connected to the source electrode 20 through a conductive path 34 that runs outside of the active regions of the HEMT 10, the field plate and the source electrode 20. As shown in FIG. 1, the path 34 runs outside the active area of the HEMT at the side opposite the gate electrode 28. In alternative embodiments according to the present invention, the conductive path could run outside the active area of the HEMT 10 on the side of the gate electrode 28, or the HEMT 10 could include two or more conductive paths running out the same or different sides of the HEMT 10.

After deposition of the field plate 30 and its connection to the source electrode 20, the active structure can be covered by a dielectric passivation layer (not shown), such as silicon nitride. Methods of forming the dielectric passivation layer are described in detail in the patents and publications referenced above.

Figure 3:
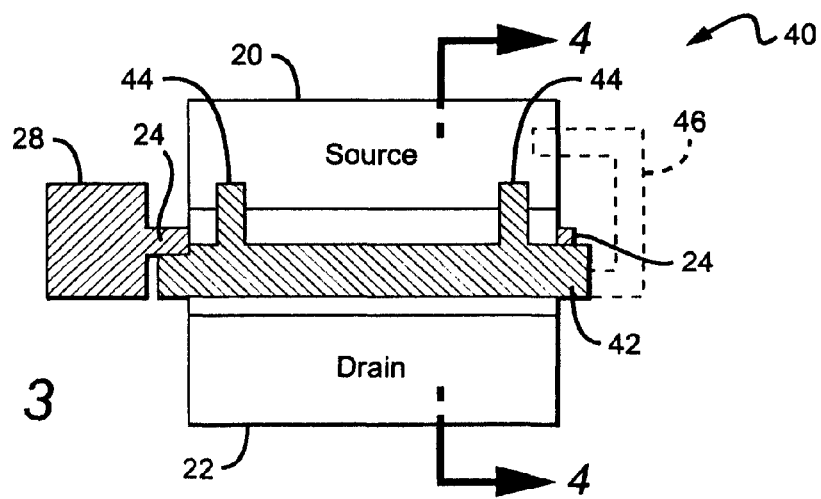
FIG. 3 is a plan view of another embodiment of a HEMT according to the present invention.
Figures 4, 5:
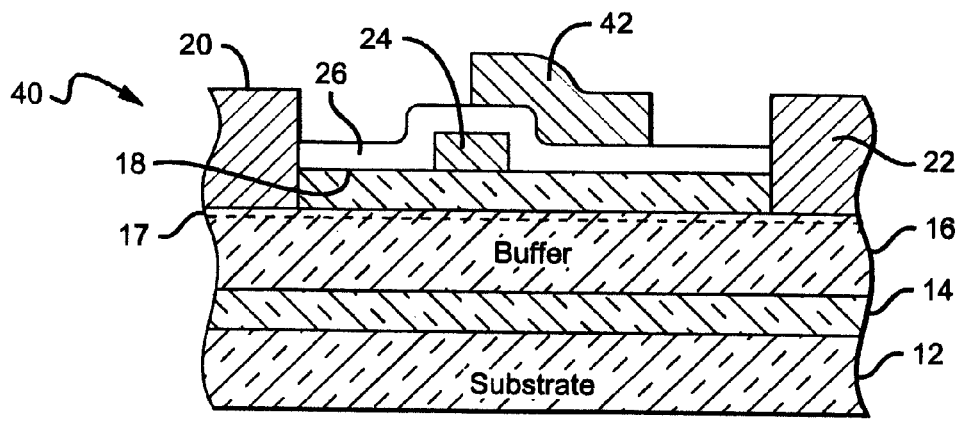
FIG. 4 is a sectional view of the HEMT in FIG. 3.
FIG. 5 is a table comparing the operating characteristics of a HEMT according to the present invention compared to a HEMT with no field plate and a HEMT with a gate connected field plate.

FIGS. 3 and 4 show another embodiment of a HEMT 40 according to the present invention having many features that are similar to those in HEMT 10 of FIGS. 1 and 2. For the similar features the same reference numerals are used and the features are introduced without full description with the understanding that the description of the features above applies equally to the HEMT 40.

The HEMT 40 comprises a substrate 12, nucleation layer 14, buffer layer 16, 2 DEG 17, barrier layer 18, source electrode 20, drain electrode 22, gate 24, spacer layer 26 and gate electrode 28. The HEMT 40 also comprises a field plate 42 that is formed on the spacer layer 26 primarily between the gate 24 and the drain electrode 22, but also overlapping a portion of the gate 24. For the HEMT 10 in FIGS. 1 and 2, $L_{gf}$ is small, which can present some difficulties during fabrication. By having the field plate 42 overlap the gate 24 the HEMT 40 can be fabricated without having to meet the tolerances of $L_{gf}$. The overlapping section of the field plate 42, however, can introduce additional unwanted capacitance. In determining whether to use a field plate 30 or 42 the ease of manufacturing using field plate 42 must be balanced with the reduced capacitance provided by field plate 30.

The HEMT 40 also comprises either buses 44 or a conductive path 46 to electrically connect the field plate 42 to the source electrode 20. After deposition of the field plate 42 and its connection to the source electrode 20, the active structure can also be covered by a dielectric passivation layer (not shown), such as silicon nitride.

FIG. 5 shows a table 50 comparing the operating characteristics of GaN based HEMTs with no field plate to HEMTs having a field plate connected to the gate, and field plate connected to the source. The tests were conducted on HEMTs having a gate length ($L_g$)=0.5 microns, field plate length ($L_f$)=1.1 microns, and a device width (w)=500 microns. HEMTs with source connected field plates exhibit improved maximum stable gain (MSG) and reduced reverse power transmission ($S_{12}$). Compared to the non field plate device, $S_{12}$ of a HEMT with a gate connected field plate is increased by 71% at 4 GHz, while that of the device with a source connected field plate is actually reduced by 28%. The reduction in $S_{12}$ for the latter in comparison with the non field plate device is attributed to the Faraday shielding effect by the grounded field plate. As a result, at 4 GHz the source connected field plate device exhibits a MSG 1.3 dB higher than the non field plate device and 5.2 dB higher than the gate connected field plate device. This advantage for source connected field plate devices was maintained at higher biases. Large signal performance was characterized by load-pull power measurement at 4 GHz. Both the gate connected field plate and source connected field plate devices outperformed the non field plate devices in both output power and power added efficiency (PAE) at 48V and above, while the source connected field plate devices consistently registered large signal gains 5-7 dB higher than that of the gate connected field plate devices.

Figure 6:
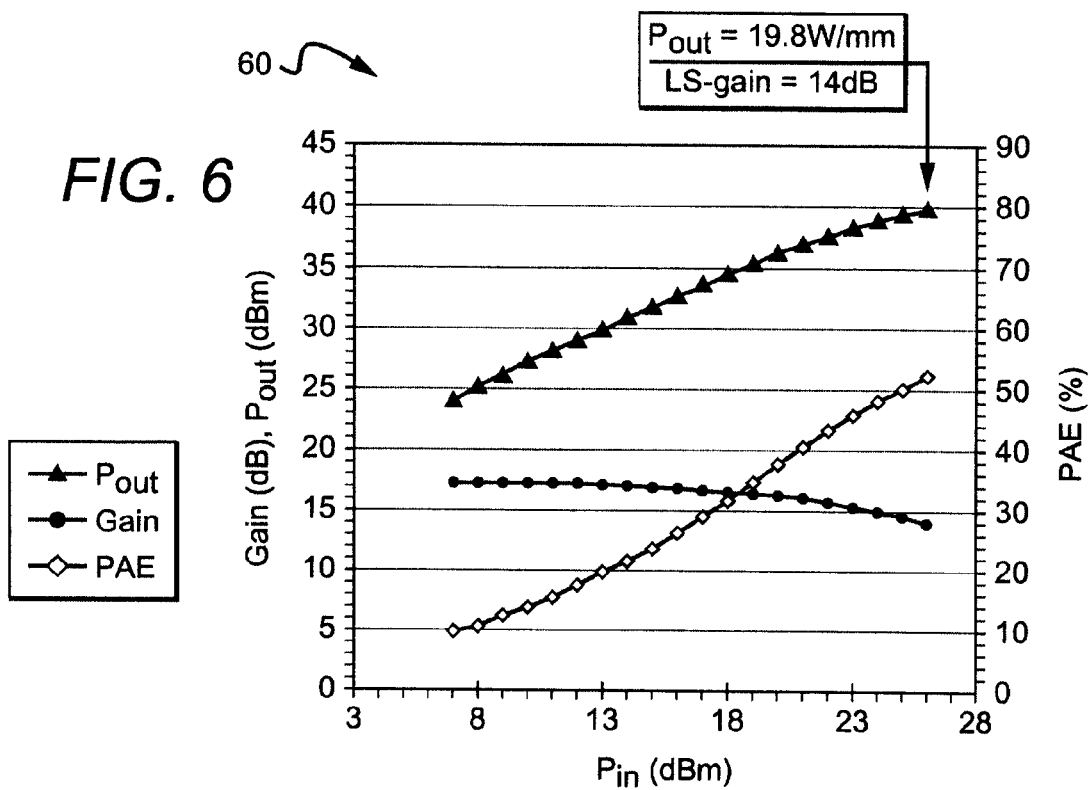
FIG. 6 is a chart showing the operating characteristics of a HEMT with a gate connected field plate.
Figure 7:
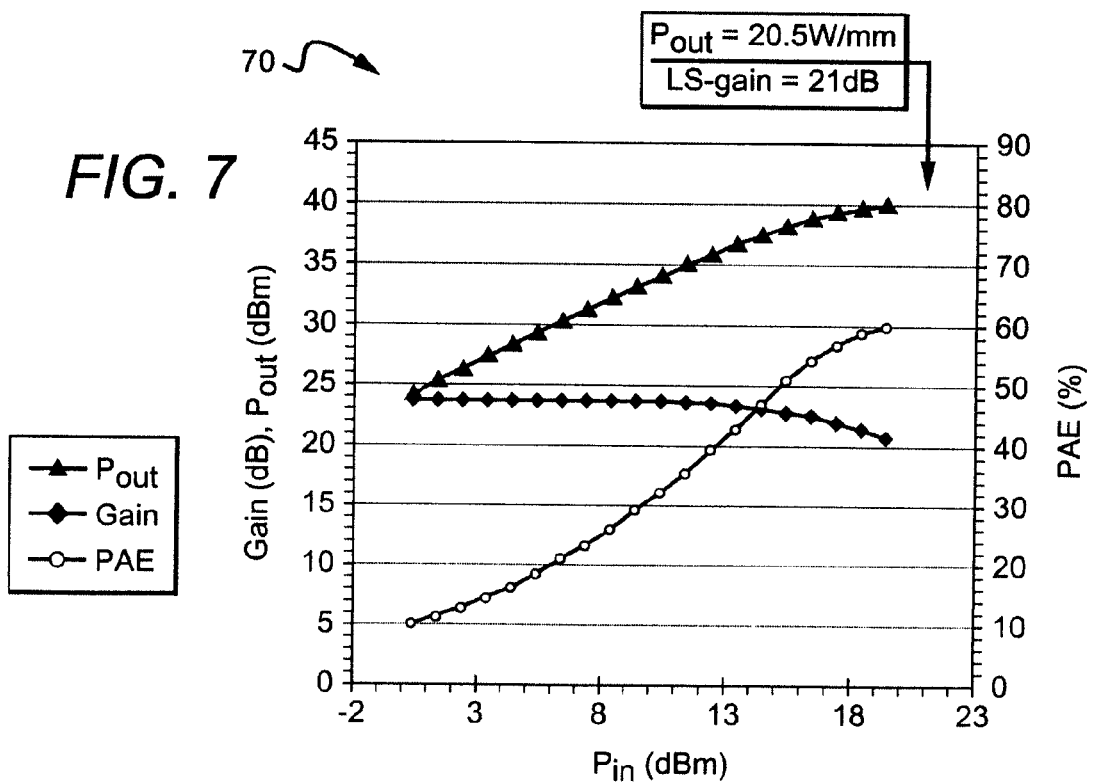
FIG. 7 is a chart showing the operating characteristics of a HEMT with a source connected field plate.

FIG. 6 is a graph 60 showing the performance of a gate connected field plate device, and FIG. 7 is a graph 70 showing the performance of a source connected field plate device. Both field plate devices were able to operate at 118 V dc bias wherein tuning was optimized for the best combination of gain, PAE and output power at 3 dB compression ($P_{3\ dB}$). While both devices generate power densities of approximately 20 W/mm, the source connected field plate device provides a 7 dB higher associated gain. With the achieved large-signal gain of 21 dB at 4 GHz and the estimated voltage swing of 224V, the voltage-frequency-gain product approaches 10 kV-GHz.

Figure 8:
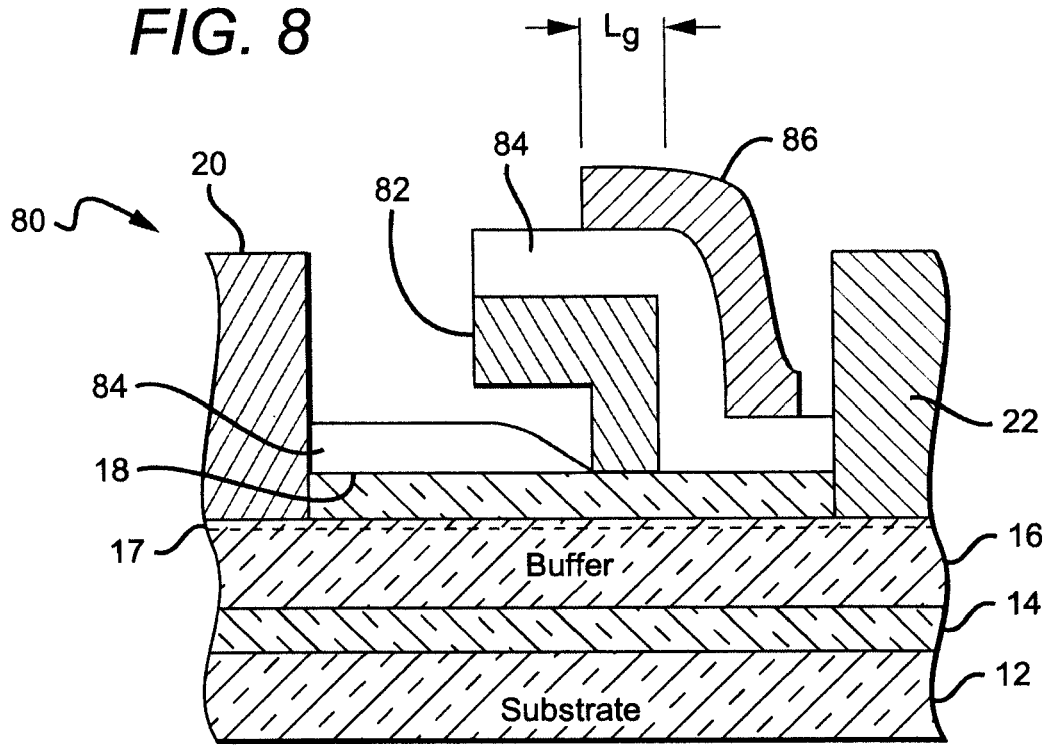
FIG. 8 is a sectional view of a HEMT according to the present invention having a gamma shaped gate.

The source connected field plate arrangement according to the present invention can be used in many different HEMTs beyond those described above. For example, FIG. 8 shows another embodiment of a HEMT 80 according to the present invention that has many features similar to those in HEMTs 10 and 40, including a substrate 12, nucleation layer 14, buffer layer 16, 2 DEG 17, barrier layer 18, source electrode 20, and drain electrode 22. HEMT 80, however, has a gamma (Γ) shaped gate 82 that is particularly adapted to high frequency operation. The gate length ($L_g$) is one of the important device dimensions in determining the speed of the device, and with higher frequency devices the gate length is shorter. Shorter gate length can lead to high resistance that can negatively impact high frequency operation. T-gates are commonly used in high frequency operation, but it can be difficult to achieve a well-coupled placement of a field plate with a T-gate.

The gamma gate 82 provides for low gate resistance and allows for controlled definition of the gate footprint. A spacer layer 84 is included that covers the gamma gate 82 and the surface of barrier layer 18 between the gamma gate 82 and the source and drain electrodes 20, 22. A space can remain between the horizontal portion of the gamma gate 82 and the top of the spacer layer 84. The HEMT 80 also includes a field plate 86 on the spacer layer 84 that overlaps that gamma gate 82, with the field plate 86 preferably deposited on the side of the gamma gate 82 not having a horizontal overhanging section. This arrangement allows for tight placement and effective coupling between the field plate 86 and the active layers below it. In other gamma gate embodiments the field plate can be similarly arranged to field plate 86, but instead of overlapping the gate, there can be a space between the edge of the gate and the field plate similar to space Lgf shown in FIG. 2.

The field plate 86 can be electrically connected to the source electrode 20 in many different ways. Because of the space between the lower surface of the horizontal section of the gate 82 and the spacer layer 84, it can be difficult to provide a conductive path directly between the field plate 86 and the source electrode 20. Instead, conductive path can be included between the field plate 86 and the source electrode 20 that runs outside the active area of the HEMT 80. Alternatively, the gamma gate 82 can be completely covered by the spacer layer 84 with the space under the gate's horizontal section filled. Conductive paths can then run directly from the field plate 86 to the source electrode over the spacer layer 84. The active structure can then be covered by a dielectric passivation layer (not shown).

Figure 9:
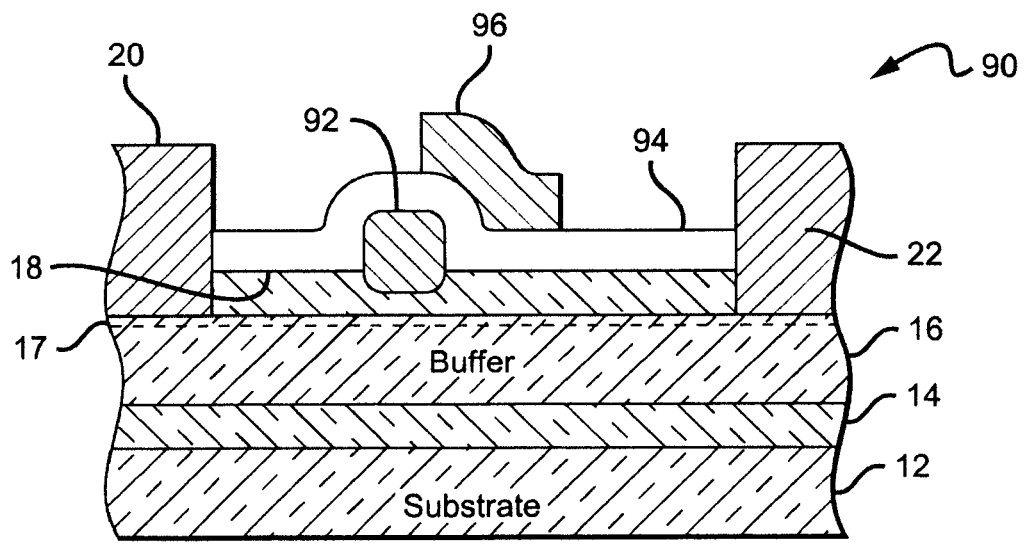
FIG. 9 is a sectional view of a HEMT according to the present invention having a recessed gate.

FIG. 9 shows still another HEMT 90 according to the present invention that can also be arranged with a source connected field plate. HEMT 90 also has many features similar to those in HEMTs 10 and 40 in FIGS. 1-4, including a substrate 12, nucleation layer 14, buffer layer 16, 2 DEG 17, barrier layer 18, source electrode 20, and drain electrode 22. The gate 92, however, is recessed in the barrier layer 18, and is covered by a spacer layer 94. In other embodiments the bottom surface of the gate can be only partially recessed or different portions of the gate can be recessed to different depths in the barrier layer 18. A field plate 96 is arranged on the spacer layer 94 and is electrically connected to the source electrode 20 and the active structure can be covered by a dielectric passivation layer (not shown).

The embodiments above provide wide bandgap transistors, particularly HEMTs, with improved power at microwave and millimeter wave frequencies. The HEMTs exhibit simultaneous high gain, high power, and more stable operation due to higher input-output isolation. The structure could be extended to larger dimensions for high voltage applications at lower frequencies.

Although the present invention has been described in considerable detail with reference to certain preferred configurations thereof, other versions are possible. The field plate arrangement can be used in many different devices. The field plates can also have many different shapes and can be connected to the source electrode in many different ways. The spirit and scope of the invention should not be limited to the preferred versions of the invention described above.

We claim:

1. A transistor, comprising:
   a plurality of semiconductor layers;
   source and drain electrodes on said semiconductor layers;
   a gate between said source and drain electrodes and on said semiconductor layers;
   a spacer layer covering at least part of a surface of the semiconductor layers between said gate and said drain, or covering at least part of the surface of said semiconductor layers between said gate and said source;
   a field plate on said spacer layer; and
   a conductive path running outside an area covered by said semiconductor layers, and between said field plate and said source electrode to electrically connect said field plate to said source electrode.

2. The transistor of claim 1, further comprising a gate electrode, wherein said conductive path runs outside of said semiconductor layers at a side opposite said gate electrode.

3. The transistor of claim 1, further comprising a gate electrode, wherein said conductive path runs outside of said semiconductor layers on the same side as said gate electrode.

4. The transistor of claim 1, further comprising a second conductive path electrically connecting said field plate to said source electrode and running outside of the area covered by said semiconductor layers on a side opposite said conductive path.

5. The transistor of claim 1, wherein said field plate extends on said spacer layer from an edge of said gate toward said drain electrode.

6. The transistor of claim 1, wherein said spacer layer at least partially covers said gate and said field plate at least partially overlaps said gate and extends on said spacer layer from an edge of said gate toward said drain electrode.

7. The transistor of claim 1, wherein said semiconductor layers are gallium nitride based.

8. The transistor of claim 1, wherein said spacer layer comprises a dielectric material.

9. The transistor of claim 1, wherein said gate is gamma shaped.

10. The transistor of claim 1, wherein said gate is at least partially recessed in one of said semiconductor layers.

11. The transistor of claim 1, wherein said field plate reduces the peak operating electric field.

12. The transistor of claim 11, wherein said reduction in peak operating electric field increases the breakdown voltage.

13. The transistor of claim 11, wherein said reduction in peak operating electric field reduces trapping.

14. The transistor of claim 11, wherein said reduction in peak operating electric field reduces leakage current.

15. A transistor, comprising:
   a barrier layer on a buffer layer;
   source and drain electrodes on said barrier layer;
   a gate on said barrier layer and between said source and drain electrodes;
   a spacer layer covering at least a portion of said buffer layer between said gate and said source, and at least a portion of said barrier layer between said gate and drain electrode; and
   a field plate formed on said spacer layer isolated from the barrier layer and extending a distance Lf from said gate toward said drain electrode, said field plate electrically connected to said source electrode by at least one conductive structure, whereby a surface between said gate and said source electrode is not covered by said conductive structure.

16. The transistor of claim 15, wherein said at least one conductive structure comprising one or more conductive paths running outside of an area covered by said buffer layer and between said field plate and said source electrode.

17. The transistor of claim 15, said spacer layer providing electrical isolation between said buffer layer and said field plate.

18. The transistor of claim 15, wherein said spacer layer comprises a dielectric material.

19. The transistor of claim 15, further comprising a substrate wherein said buffer and barrier layer are on said substrate.

20. The transistor of claim 15, covered by a passivation layer.

21. The transistor of claim 15, wherein said field plate reduces the peak operating electric field in said HEMT.

* * * * *